United States Patent [19]

Young

[11] Patent Number: 4,617,530

[45] Date of Patent: Oct. 14, 1986

[54] PSEUDO-RANDOM NOISE GENERATOR

[75] Inventor: James R. Young, Palo Alto, Calif.

[73] Assignee: The United States of America as represented by the Secretary of the Navy, Washington, D.C.

[21] Appl. No.: 745,155

[22] Filed: Jun. 17, 1985

[51] Int. Cl.⁴ .................... H03B 29/00; G08B 3/00
[52] U.S. Cl. ................................ 331/78; 340/384 E
[58] Field of Search .................. 331/42, 78; 455/1; 375/22; 364/717; 340/384 E

[56] References Cited

U.S. PATENT DOCUMENTS

| | | | |
|---|---|---|---|
| 3,439,279 | 4/1969 | Guanella | 328/63 |
| 3,720,944 | 3/1973 | Kramer et al. | 455/1 X |
| 3,940,632 | 2/1976 | Padgug | 331/78 X |
| 4,179,663 | 12/1979 | Vasseur | 331/78 X |
| 4,296,384 | 10/1981 | Mishima | 331/78 |
| 4,516,217 | 5/1985 | Starner | 331/78 X |

Primary Examiner—Eugene R. LaRoche
Assistant Examiner—D. C. Mis
Attorney, Agent, or Firm—T. M. Phillips; R. F. Beers

[57] ABSTRACT

A circuit for generating a noise signal for use in a jet engine noise simulator which utilizes two component pseudo-random noise (PSN) generators and a combination field effect transistor (FET) and resistor circuit to which the outputs of the PSN generators are connected such that the signal from one PSN generator is modulated by the signal from the other PSN generator.

8 Claims, 1 Drawing Figure

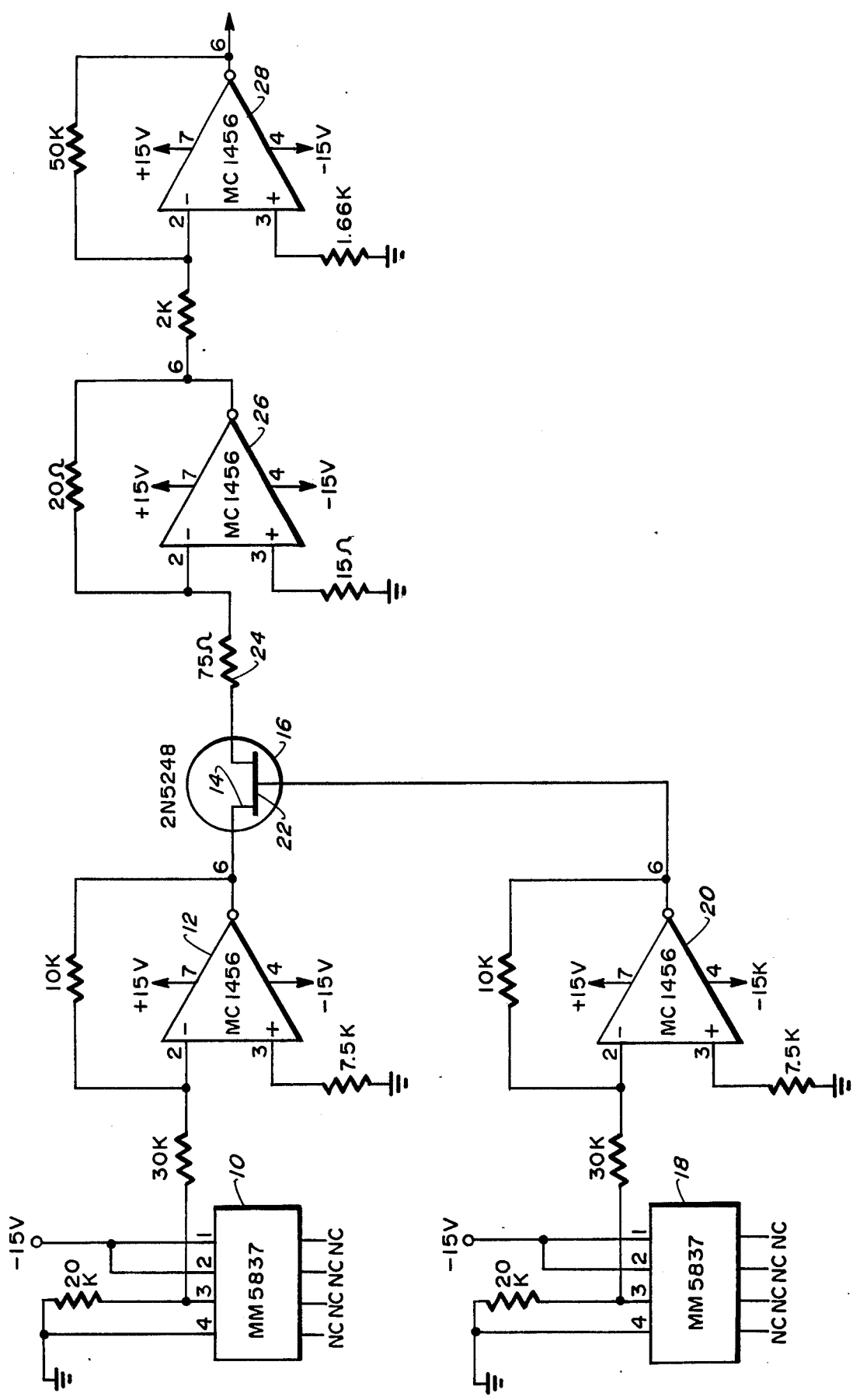

PSEUDO-RANDOM NOISE GENERATOR

BACKGROUND OF THE INVENTION

1. Field of the Invention

The present invention relates to the simulation of jet engine noise and more particularly to a circuit for generating pseudo-random noise with arbitrarily long repetition rates.

2. Description of the Prior Art

There are several known devices for simulating jet engine noise. Mayer et al, U.S. Pat. No. 4,314,236, teaches production of a variety of audio sound effects by utilizing a variable digital noise generator driven by a variable clock, the audio output is shaped by either selectively ANDing the outputs or by gated resistive summing of the output signals. U.S. Pat. No. 4,296,384 to Mishima teaches the use of a single pseudo-random pulse generator, which is clock driven, in combination with a bandwidth designating circuit and means for converting the digital output of the generator to an analog signal. U.S. Pat. Nos. 4,023,078 and 3,831,172 to Olliges et al disclose a circuit for simulating jet engine noise which utilizes a single random noise generator which in turn is coupled to a modulating circuit. U.S. Pat. No. 3,718,987 to Carver teaches the use of two voltage controlled rectifiers for simulation of jet engine whine. The voltage controlled oscillators have slightly different frequencies and are summed in a resistive circuit to obtain a signal which contains all of the desired harmonics.

None of the known prior art devices provides for simulating jet engine noise with arbitrarily long repetition rates which are required for realism. This realism in jet engine noise is required in apparatus used to trigger anti-aircraft bombs planted on runways and for deception of sensors used for simulators.

SUMMARY OF THE INVENTION

An object of the invention is to provide an improved pseudo-random noise generator for use in the simulation of jet aircraft noise, where a long repetition period is required for realism. This and other objects of the invention are realized by combining the outputs of two component pseudo-random noise generators which have different periodicity such that the signal from one generator is modulated by the signal from the other.

BRIEF DESCRIPTION OF THE DRAWING

The single figure is a schematic diagram of the preferred embodiment of the invention.

DESCRIPTION OF THE PREFERRED EMBODIMENT

Referring now to the drawing wherein there is shown in the single figure a first pseudo-random noise generator 10 coupled through a first buffer amplifier 12 to the source electrode 14 of field effect transistor 16. A second pseudo-random noise generator 18 is coupled through a second buffer amplifier 20 to the gate electrode 22 of field effect transistor 16. The input signals to electrodes 14 and 22 of transistor 16 are in effect combined logically to provide an output signal across resistor 24 that has an arbitrarily long repetition period. This signal is fed through two amplifier stages 26 and 28 to provide the drive signal to an electropneumatic transducer (not shown) for driving the low frequency horn of a jet aircraft noise simulator.

The values and device designation assinged to the various components shown in the drawing have been found to be satisfactory in practicing the invention. The outputs of the two pseudo-random generators 10 and 18 are not identical (this is inherent in their manufacture), particularly in the length of their periods. The one with the longer period is designated A with a period TA. The other is designated B with a period TB and $\Delta = TA - TB$. It can be shown that the periodicity of the combined signal is $TC \geq TA\Delta$. When $\Delta$ is small, TC is large.

Each of noise sources 10 and 18 is a 17-bit shift register driven by a 100-kHz clock. The outputs of the 14th and 17th stages are combined in an "Exclusive OR" circuit to produce a feedback signal to the register. This produces a random pattern of high and low voltages that is repeated every second. When the outputs of noise sources 10 and 18 are combined as is descibed above, a signal is produced that repeats on the order of minutes. This amplified signal is used to drive a transducer to modulate the air stream through a low-frequency horn in a random pattern.

Obviously many modifications and variations of the present invention are possible in light of the above teachings. It is therefore to be understood that within the scope of the appended claims the invention may be practiced otherwise than as specifically described.

What is claimed is:

1. An improved psuedo-random noise generator comprising:
    a first random pulse generator for generating random pulses that are repeated at a first time interval,
    a second random pulse genrator for generating random pulses that are repeated at a time interval that is different from said first time interval, and
    circuit means coupled to said first and second pulse generators for ANDing the outputs of said pulse generators to produce a noise signal having a long repetition period that repeats at least every minute.

2. The noise generator of claim 1 wherein said first and second pulse generators are component pseudorandom noise generators having short repetition periods on the order of seconds.

3. The noise generator of claim 1 wherein said circuit means is a combination field effect transistor and resistor circuit to which the outputs of the pulse generators are connected such that the signal from one pulse generator is modulated by the signal from the other pulse generator.

4. The noise generator of claim 1 wherein said circuit means is a field effect transistor having a source electrode connected to said first pulse generator, a gate electrode connected to said second pulse generator and a collector electrode connected to a resistor network.

5. The noise generator of claim 2 wherein said circuit means is a combination field effect transistor and resistor circuit to which the outputs of the pulse generators are connected such that the signal from one pulse generator is modulated by the signal from the other pulse generator.

6. The noise generator of claim 2 wherein said circuit means is a field effect transistor having a source electrode connected to said first pulse generator, a gate electrode connected to said second pulse generator and a collector electrode connected to a resistor network.

7. An improved pseudo-random noise generator comprising:
- a first random pulse generator for generating random pulse that are repeated approximately every second,
- a second random pulse generator for generating random pulse sequences that are repeated approximately every second,
- the periodicity of said second pulse generator being slightly different from the periodicity of said first pulse generator,
- a field effect transistor having a source electrode connected to said first pulse generator, a gate electrode connected to said second pulse generator and a collector electrode connected to a resistor network whereby a random noise signal is provided across said resistor network that is the resultant of the signal from said first pulse generator being modulated by the signal from said second pulse generator that repeats at least every minute.

8. An improved psuedo-random noise generator comprising:
- first and second pseudo-random noise generators for generating random patterns of high and low voltages that are repeated approximately every second,
- a field effect transistor having a source electrode connected to said first noise generator and having a gate electrode connected to said second noise generator whereby the signal from said second noise generator modulates the output of said first noise generator to provide an output signal having long repetition rates on the order of minutes.

* * * * *